United States Patent
Shelton et al.

(10) Patent No.: US 6,358,819 B1
(45) Date of Patent: Mar. 19, 2002

(54) DUAL GATE OXIDE PROCESS FOR DEEP SUBMICRON ICS

(75) Inventors: Gail D. Shelton; Gayle W. Miller, both of Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/212,315

(22) Filed: Dec. 15, 1998

(51) Int. Cl.[7] ................................................ H01L 21/76
(52) U.S. Cl. .................. 438/433; 438/440; 438/449; 438/283; 438/287; 148/DIG. 163
(58) Field of Search ................ 148/DIG. 163; 438/433, 440, 449, 283, 287

(56) References Cited

U.S. PATENT DOCUMENTS

| | | | |
|---|---|---|---|
| 4,047,974 A | 9/1977 | Harari | 148/1.5 |
| 4,469,527 A | 9/1984 | Sugano et al. | 148/15 |
| 5,273,921 A | 12/1993 | Neudeck et al. | 437/41 |
| 5,446,299 A | 8/1995 | Acovic et al. | 257/316 |
| 5,604,366 A | 2/1997 | Lee | 257/316 |
| 5,646,058 A | 7/1997 | Taur et al. | 437/40 |
| 5,652,166 A | 7/1997 | Sun et al. | 437/56 |
| 5,661,043 A | 8/1997 | Rissman et al. | 438/162 |
| 5,665,613 A | 9/1997 | Nakashima et al. | 438/51 |
| 5,736,435 A | 4/1998 | Venkatesan et al. | 438/151 |
| 5,895,252 A * | 4/1999 | Lur et al. | |
| 6,027,977 A * | 2/2000 | Mogami | |
| 6,808,682 * | 6/2000 | Ibok | |
| 6,093,659 A * | 7/2000 | Grider et al. | |

* cited by examiner

Primary Examiner—Long Pham
Assistant Examiner—Scott J. Hawranek

(57) ABSTRACT

An improved dual gate oxide process for dual-gated devices using oxygen ion implantation to vary the thickness of gate oxide layers. The desired layers are identified by photoresist layer patterning prior to an ion implantation. A subsequent heat treatment oxidizes the implanted region.

33 Claims, 2 Drawing Sheets

DUAL GATE OXIDE PROCESS FOR DEEP SUBMICRON ICS

BACKGROUND OF THE INVENTION

1. Technical Field

The present invention relates to a method for fabricating a dual gate oxide for deep submicron integrated circuit systems (ICS) using non-critical photolithographic masking to select implantation areas followed by oxygen ion implantation into the selected areas.

2. Description of Related Art

The increasing diversity of design requirements for metal oxide semiconductor (MOS) devices, such as dual voltage requirements on chip input/output, the need to tolerate higher voltages, and the need to handle higher power supply inputs, has driven the semiconductor industry towards the increased use of gate oxide layers of different thicknesses. A number of methods have been proposed to meet this demand. For example, U.S. Pat. No. 5,273,921 (Neudeck, et al.) proposes several methods for fabricating a dual-gated semiconductor-on-insulator field effect transistor. By in large, however, present techniques for dual-gated oxide processes have several complex processing steps, some of which entail high processing temperatures. The heat treatment steps typically expose the device to temperatures in the range of 600 to 1000° C. for as long as 4 hours. The present methods for producing dual-gate oxides are, therefore, undesirable not only for the additional time and expense added to the processing due to the complexity of the procedures, but also because of the undesirability of the high processing temperatures, which are difficult to accommodate in device designs in light of the undesired diffusion of impurities caused by heat exposure. The criticality of wet etch processing and other complexities in the various present art dual-gate oxide processes further makes the uniformity of the oxide layers difficult to precisely control, thus leading to quality control problems.

Accordingly, a need exists for a relatively simple method of accomplishing a dual-gate oxide device architecture. Preferably, this method should reduce the criticality of wet clean/oxide etch back steps as well as reduce the need for high processing temperatures. A desirable dual-gate oxide process would reduce the complexity of creating MOS integrated circuits with two or more different gate oxide thicknesses to a few simple steps and allow for control of the final thickness and uniformity independent of ambient flow pattern characteristics and the variable delivery of oxidizing species to the surface of the wafer.

SUMMARY OF THE INVENTION

A method for fabricating a dual-gate oxide for MOS devices is disclosed using a photoresist masking layer applied after the first layer of gate oxide is grown on the wafer. The photoresist layer is removed from areas where thicker gate oxide material is desired. A low energy implantation of oxygen ions is then performed. The remaining photoresist is removed and the surface is cleaned followed by a heat treatment, thus resulting in the oxidation of the silicon of the surface underneath the gate oxide material.

This invention reduces the complexity of creating MOS integrated circuits with two different gate oxide thicknesses to a simple photolithography step combined with an ion implantation technique. The criticality of wet etch processing of present state of the art processes is eliminated or substantially reduced. The final thickness uniformity is independent of ambient flow pattern characteristics and variable delivery of oxidizing species to the surface of the wafer. Since the invention does not involve several high processing temperature steps, the undesired diffusion of impurity is avoided.

The above as well as additional features and advantages of the present invention will become apparent in the following written detailed description.

DESCRIPTION OF THE DRAWINGS

The novel features believed characteristic of the invention are set forth in the appended claims. The invention itself, however, as well as a preferred mode of use, further objectives and advantages thereof, will be best understood by reference to the following detailed description of illustrative embodiments when read in conjunction with the accompanying drawings, wherein:

DETAILED DESCRIPTION

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
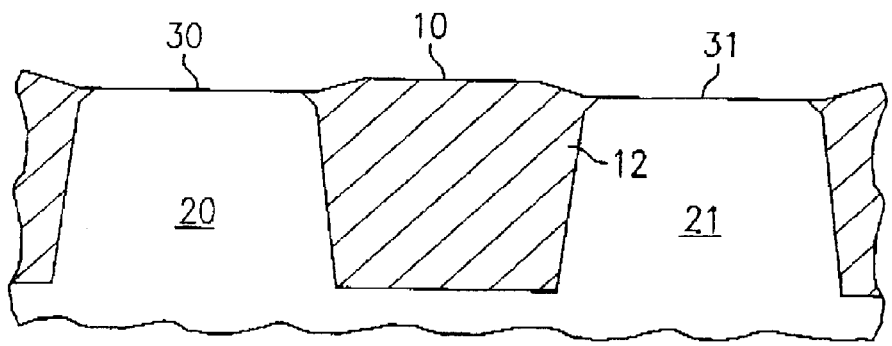
FIG. 1 illustrates a cross-sectional side view of a selected section of an MOS device showing the active areas defined.

FIG. 1 shows a cross-sectional side view of a selected portion of a MOS device. The embodiment illustrated shows a portion of the device comprising a shallow trench 10 filled with cvd oxide 12 within two pedestals 20, 21 of the silicon substrate. In this illustration, a design determination has been made to deposit a thick gate oxide on a surface 30 above one pedestal 20, while a thin gate oxide is to be deposited on the surface 31 of the other pedestal 21.

Figure 2:
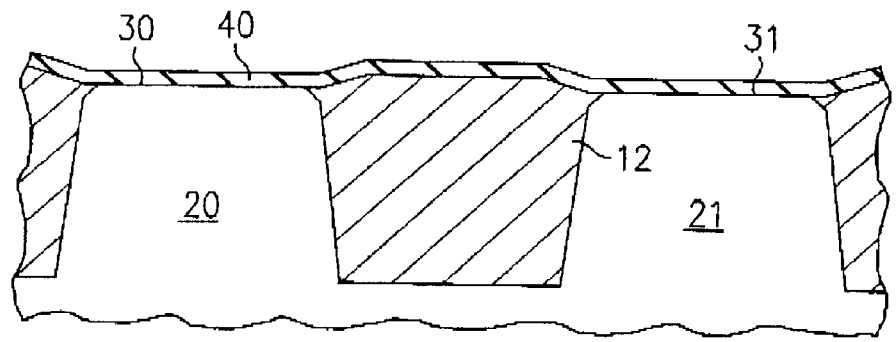
FIG. 2 illustrates a cross-sectional side view of a selected section of an MOS device showing the growth of a thin gate oxide.

FIG. 2 shows the same section of the MOS device with a thin gate oxide or insulating layer 40 grown on the exposed surface of the device. Corresponding reference numerals are used to represent corresponding elements unless indicated otherwise. Following a normal cleaning process, this insulating layer 40 is grown on the wafer using one of the well known methods of the present art. For example, if a nitrided gate oxide is preferred as the insulating layer 40, such a film can be deposited on the wafer by growing the film in an ambient of nitrous oxide, perhaps including chlorine from one of the usual precursors, including trichloroethylene (TCE). The typical thickness of such film would be between about 40 to about 50 Angstroms.

Figure 3:
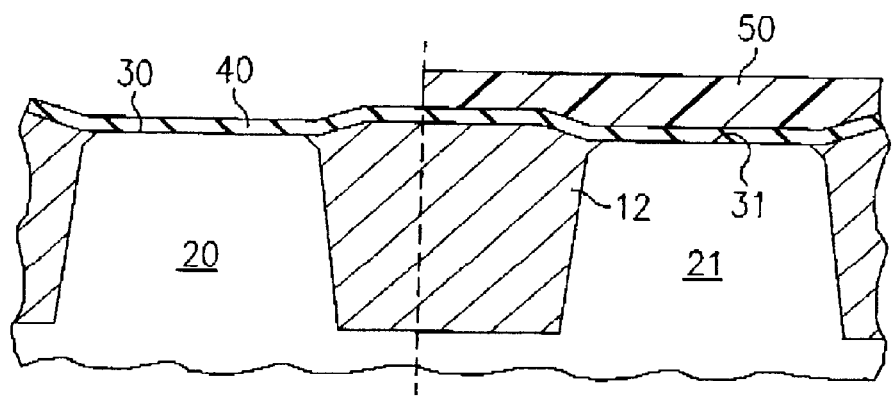
FIG. 3 illustrates a cross-sectional side view of a selected section of an MOS device showing a thin gate oxide covered with a photo resist pattern.

Referring now to FIG. 3, next, a photoresist masking layer 50 is applied and patterned in the usual way. The area 30 where the thicker gate oxide material is desired is exposed by removing the photoresist from this location. Conversely, the area 31 where the thin gate oxide is desired remains masked by the photoresist masking layer 50.

Figure 4:
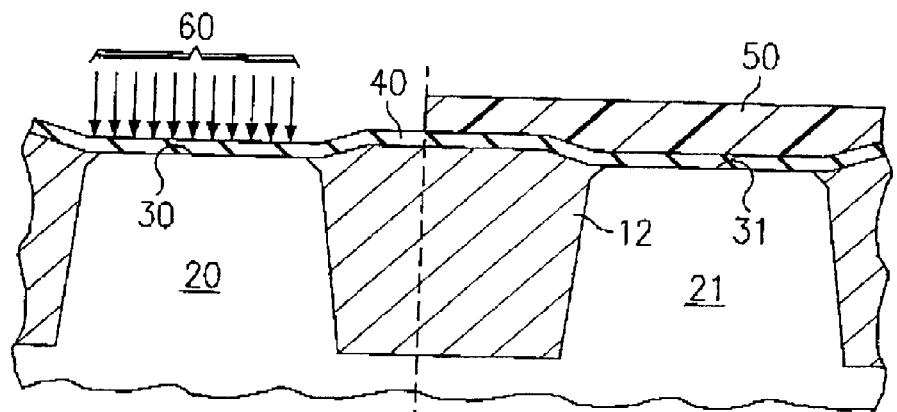
FIG. 4 illustrates a cross-sectional side view of a selected section of an MOS device showing the implantation of oxygen ions to the thick gate active areas.

The next step, that of a low energy implantation of oxygen ions, is illustrated in FIG. 4. The oxygen ion 60 implantation will occur on the area 30 where the thicker gate oxide material is desired, while the area 31 where the thinner gated oxide material is desired remains masked by the photo resist material 50. The low energy implantation of oxygen ions 60 is preformed using an accelerating voltage typically in the range of 200 to 800 eV. A preferred source of these ions is an oxygen plasma. A magnetic field, typically in the range of about 1 to about 100 gauss is used to increase the density of oxygen ions in the plasma. A DC voltage is used to extract the ion from the plasma, imparting a single direction to the extracted ions towards the desired surface 30. Alternatively, conventional ion implant technology can be employed. The peak range of the implanted ion 60 will be from about 20 to about 50 Angstroms, with a range straggle of about 10 to about 25 Angstroms.

Figure 5:
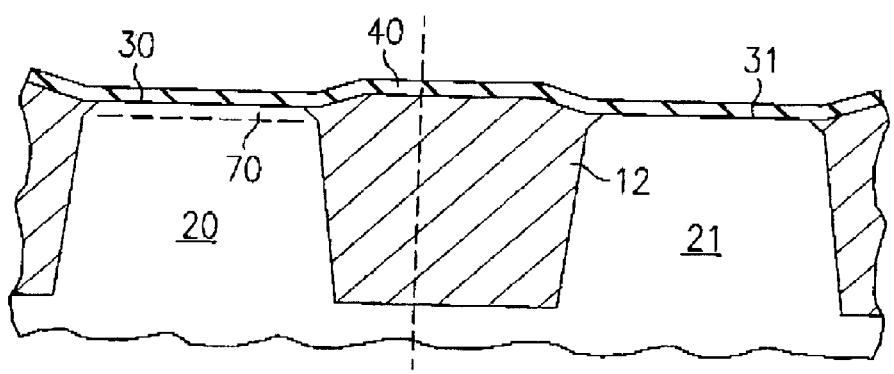
FIG. 5 illustrates a cross-sectional side view of a selected section of an MOS device showing the photoresist cleaned from the patterned areas; and, FIG. 6 illustrates a cross-sectional side view of a selected section of an MOS device showing the wafer heat treated to oxidize the implanted silicon.

FIG. 5 illustrates the removal of the photoresist and cleaning of the surface. At this point, the area 30 designated for the thick gate oxide layer and the area 31 designated for the thin gate oxide are still covered by the thin gate oxide layer 40 grown earlier as illustrated in FIG. 2. However, below the thin gate oxide layer 40 in the area 20 where the thick gate oxide is desired resides a zone 70 where the implanted ions described above reside. The dose of the implanted ions should result in an ion concentration in this layer 70 in the range of about $2 \times 10^{16}$ to about $1 \times 10^{17}$ ions per square centimeter.

Figure 6:
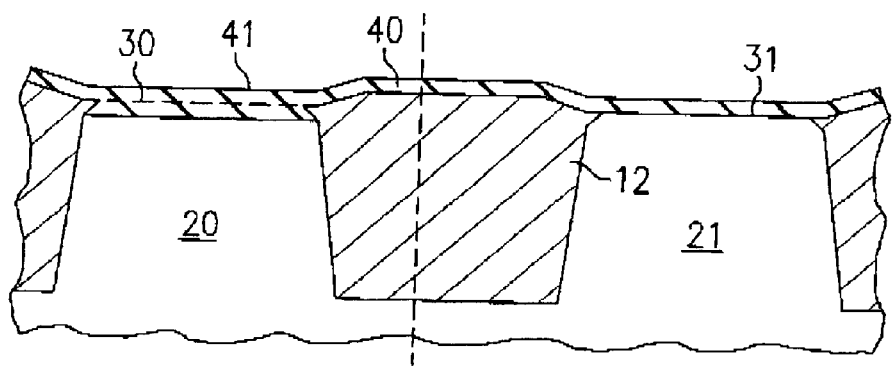

Following the removal of the photoresist and cleaning of the surface, a subsequent heat treatment will result in the oxidation of the silicon at the surface underneath the nitrided gate oxide material 40, as shown in FIG. 6. The heat treatment is conducted at a temperature range of about 400 to about 600° C. for a period of about 30 to about 120 minutes. This treatment will result in a thickened gate oxide region 41, yet is performed at a lower temperature than prior art procedures. The thickness of oxide added in the area 30 where the thick gate oxide is desired will depend on the dose of oxygen ions. Doses of the suggested density levels disclosed above will result in about 10 to about 40 Angstroms of additional silicon dioxide underneath the silicon nitride, respectively.

In another embodiment of the invention, an additional region of yet another thickness of gate oxide could be accomplished by repeating the above steps and varying the parameters as desired.

While the invention has been particularly shown and described with reference to preferred embodiment, it will be understood by those skilled in the art that various changes in form and detail may be made therein without departing from the spirit and scope of the invention.

What is claimed is:

1. A method of forming gate oxide layers of different thicknesses on an integrated circuit device which comprises the steps of:
   (a) growing a gate oxide layer on the device;
   (b) applying a photoresist mask layer over the oxide layer;
   (c) removing the photoresist mask where thicker oxide areas are desired;
   (d) performing an oxygen ion implantation on the surface of the device;
   (e) removing the photoresist layer; and,
   (f) heating the device to oxidize the implanted silicon.

2. The method of claim 1 wherein the oxygen ion implantation of step (d) is accomplished using oxygen plasma in a magnetic field.

3. The method of claim 1 wherein the oxide layer of step (a) is in an approximate range of about 35 Angstroms to about 55 Angstroms thick.

4. The method of claim 1 wherein the oxygen ion implantation of step (d) is performed using an accelerating voltage in an approximate range of about 200 eV to about 800 eV.

5. The method of claim 2 wherein the magnetic field is generally in a range of about 1 gauss to about 100 gauss.

6. The method of claim 1 wherein the resulting peak range of implanted ions is in an approximate range of about 20 Angstroms to about 50 Angstroms with a range of straggle of about 10 Angstroms to about 25 Angstroms.

7. The method of claim 1 wherein the heating of step (f) occurs in a range of about 400° C. to about 600° C. for a time period in the range of about 30 minutes to about 120 minutes.

8. The method of claim 1 wherein the gate oxide of step (a) is a nitrided gate oxide.

9. A method of forming gate oxide layers of different thicknesses on a metal oxide semiconductor device having a layer of gate oxide, the method comprising the steps of:
   (a) applying a patterned photoresist layer over the oxide layer;
   (b) performing an oxygen ion implantation on the surface of the integrated circuit;
   (c) removing the photoresist layer; and,
   (d) heating the device to oxidize an ion implanted layer.

10. The method of claim 9 wherein steps (a) through (d) are performed sequentially at least twice.

11. The method of claim 9 wherein oxygen ion implantation of step (b) is accomplished using oxygen plasma in a magnetic field.

12. The method of claim 9 wherein the oxygen ion implantation of step (b) is performed using an accelerating voltage in an approximate range of about 200 eV to about 800 eV.

13. The method of claim 11 wherein the magnetic field is generally in a range of about 1 gauss to 100 gauss.

14. The method of claim 10 wherein the resulting peak range of implanted ions is in an approximate range of about 20 Angstroms to about 50 Angstroms with a range of straggle of about 10 Angstroms to about 25 Angstroms.

15. The method of claim 9 wherein the heating of step (d) occurs in a range of about 400° C. to about 600° C. for a time period range of about 30 minutes to about 120 minutes.

16. A method for forming gate oxide on a substrate, the method comprising:
   forming a gate oxide layer on the substrate;
   selectively forming a photoresist layer over the gate oxide, wherein a portion of the gate oxide layer remains exposed to from an exposed portion;
   introducing oxygen ions into the exposed portion; and,
   oxidizing the substrate, wherein the exposed portion of the gate oxide layer is thicker than other portions of the gate oxide layer.

17. The method of claim 16 wherein the oxidizing step comprises:
   heating the substrate.

18. The method of claim 17 wherein the heating of the substrate occurs in a range of about 400° C. to about 600° C. for a time period of about 30 minutes to about 120 minutes.

19. The method of claim 16 further comprising:

forming a first pedestal and a second pedestal in the substrate prior to the forming step, wherein a cavity separates the first pedestal from the second pedestal, wherein the exposed portion of the gate oxide includes the first pedestal and excludes the second pedestal.

20. The method of claim 19 wherein the cavity is filled with oxide.

21. The method of claim 16 wherein the step of introducing oxygen ions comprises:

implanting oxygen ions into the exposed portion of the gate oxide layer.

22. The method of claim 21 wherein the implanting step is performed using oxygen plasma in a magnetic field.

23. Method of claim 16 further comprising removing the photoresist layer after the introducing step.

24. The method of claim 16 wherein the substrate is a silicon substrate.

25. The method of claim 16 wherein the oxygen ions of the introducing step are implanted resulting in a peak range of implanted ions of about 20 Angstroms to about 50 Angstroms with a range straggle of about 10 Angstroms to about 25 Angstroms.

26. A method of forming a dual gate oxide comprising:

forming a first gate region and a second gate region;

depositing an oxide layer over the first gate region and the second gate region;

masking the first gate region, wherein a surface of the second gate region remains exposed to from an exposed surface;

implanting oxygen ions into the exposed surface; and oxidizing a substrate, wherein a thickness of the oxide layer over the first gate region is thinner that a thickness of the oxide layer over the second gate region.

27. The method of claim 26 wherein the masking step comprises:

depositing a photoresist layer over the gate oxide layer; and, removing the photoresist layer over the surface of the first gate region, wherein the surface of the first gate region remains exposed to form an exposed surface.

28. The method of claim 27 wherein the oxidizing step comprises:

heating the substrate such that the substrate is oxidized.

29. The method of claim 28 wherein the heating of the substrate occurs in a range of about 400° C. to about 600° C. for a time period of about 30 minutes to about 120 minutes.

30. The method of claim 26 wherein the substrate is a silicon substrate.

31. The method of claims 26 wherein the oxide layer deposited over the first gate region and the second gate region is a nitrided gate oxide.

32. The method of claim 26 wherein the ion implantation is accomplished using oxygen plasma in a magnetic field.

33. The method of claim 32 wherein the magnetic field is generally in a range of about 1 gauss to about 100 gauss.

\* \* \* \* \*